United States Patent
Nguyen et al.

(10) Patent No.: US 8,576,888 B2
(45) Date of Patent: Nov. 5, 2013

(54) DUAL LASER-POWER-LEVEL CONTROL AND CALIBRATION SYSTEM FOR BURST-MODE AND CONTINUOUS-MODE TRANSMITTER

(75) Inventors: James Cong Nguyen, Portland, OR (US); Matthew Christopher La Voie, Hillsboro, OR (US); Jan Filip, Portland, OR (US)

(73) Assignee: Maxim Integrated Products, Inc., San Jose, CA (US)

( * ) Notice: Subject to any disclaimer, the term of this patent is extended or adjusted under 35 U.S.C. 154(b) by 191 days.

(21) Appl. No.: 13/282,283

(22) Filed: Oct. 26, 2011

(65) Prior Publication Data

US 2012/0106953 A1 May 3, 2012

Related U.S. Application Data

(60) Provisional application No. 61/408,532, filed on Oct. 29, 2010, provisional application No. 61/409,418, filed on Nov. 2, 2010.

(51) Int. Cl.
*H01S 3/00* (2006.01)

(52) U.S. Cl.
USPC ............... 372/38.02; 372/25; 372/29.011; 372/29.02; 372/38.01

(58) Field of Classification Search
USPC ............ 372/25, 29.011, 29.02, 38.02
See application file for complete search history.

(56) References Cited

U.S. PATENT DOCUMENTS

| | | | |
|---|---|---|---|
| 3,588,701 A * | 6/1971 | Freepo | .............. 455/73 |
| 5,502,298 A | 3/1996 | Geller | |
| 5,535,038 A | 7/1996 | Hinch | |
| 5,850,409 A | 12/1998 | Link | |
| 5,974,063 A | 10/1999 | Toshida | |
| 6,414,974 B1 | 7/2002 | Russell et al. | |
| 6,807,209 B2 | 10/2004 | Martinez et al. | |
| 6,829,267 B2 | 12/2004 | Vaughan et al. | |
| 6,859,473 B1 | 2/2005 | Tan | |
| 6,907,055 B2 | 6/2005 | Morley et al. | |
| 6,928,094 B2 | 8/2005 | Asuri et al. | |
| 6,993,459 B2 | 1/2006 | Carrick | |
| 7,088,752 B2 | 8/2006 | Harker | |
| 7,142,574 B2 | 11/2006 | Asuri et al. | |
| 7,245,828 B2 | 7/2007 | Hauenschild et al. | |
| 7,330,666 B1 * | 2/2008 | Koley | ............ 398/188 |
| 7,349,454 B2 | 3/2008 | Quek et al. | |

(Continued)

OTHER PUBLICATIONS

Agilent Technologies, Inc., "Agilent N77-Series Attenuators, Data Sheet, Version 2.0", N7751A, N7752A, N7761A, N7762A, N7764A, N7766A, N7768A, (undated document), pp. 1-9.

(Continued)

*Primary Examiner* — Dung Nguyen
(74) *Attorney, Agent, or Firm* — Blakely Sokoloff Taylor & Zafman LLP

(57) ABSTRACT

Dual laser-power-level control and calibration system for burst-mode and continuous-mode transmitter. A first signal path receives a transmit signal that also drives the transmit laser, and a second signal path receives the output of a monitor diode. The first and second signal paths include filtering so that the two signal paths have a similar frequency response. The upper and lower excursions in both signal paths are compared, and the power levels of the optical transmitter are adjusted based on those comparisons. Embodiments with one control loop and two control loops are disclosed.

46 Claims, 12 Drawing Sheets

(56) References Cited

U.S. PATENT DOCUMENTS

| | | |
|---|---|---|
| 2002/0027690 A1 | 3/2002 | Bartur et al. |
| 2005/0078766 A1* | 4/2005 | Simon .......................... 375/296 |
| 2005/0226292 A1 | 10/2005 | Nagai et al. |
| 2009/0310961 A1 | 12/2009 | Bowler et al. |

OTHER PUBLICATIONS

Agilent Technologies, Inc., "Infiniium DCA-X, Agilent 86100D Wide-Bandwidth Oscilloscope Mainframe and Modules, Technical Specifications", (undated document), pp. 1-27.

\* cited by examiner

Weighted Moving Average for Tracking Loop Updating
(Similar Loop Filter for $ERR_1$ updating $I_1$)

DUAL LASER-POWER-LEVEL CONTROL AND CALIBRATION SYSTEM FOR BURST-MODE AND CONTINUOUS-MODE TRANSMITTER

CROSS-REFERENCE TO RELATED APPLICATIONS

This application claims the benefit of U.S. Provisional Patent Application No. 61/408,532 filed Oct. 29, 2010 and U.S. Provisional Patent Application No. 61/409,418 filed Nov. 2, 2010.

BACKGROUND OF THE INVENTION

1. Field of the Invention

The present invention relates to the field of solid state laser drivers.

2. Prior Art

Laser drivers of various designs are well known in the prior art. Such devices are used to drive solid state lasers in optical transmitters for optical transmission of data over fiber optic lines. These devices are capable of high data rates, and accordingly, are finding ever increasing application in data communications. Solid state lasers, however, have various characteristics that must be accounted for in such applications. One such characteristic is that, at least for high data rates, solid state lasers are not operated between on and off conditions because of the time it takes for the laser, when fully off, to get back into a lasing condition. Accordingly, for high data rates, such lasers are commonly operated between a high optical power level as one data state and a much lower power level for the second data state. For purposes herein, it will be assumed that the high optical power level will represent a logic 1 and the low optical power level will represent a logic 0. The ratio of optical power levels, $P_1$ for the high optical power level and $P_0$ for the low optical power level, is referred to as the extinction ratio ($P_1/P_0$). Normally the user of the laser driver, i.e., the manufacturer of the optical transmitter, desires to set and control the extinction ratio and the average power. Furthermore the laser driver outputs a DC current Ibias ensuring laser operation in lasing mode and a modulated AC current Imod defining the logic 1 optical power level and the logic 0 optical power level.

There are two general types of optical transmitters: continuous and time-division multiplexed, such as a passive optical network (PON). The PON system requires a control signal, burst enable (BEN), which manages multiple transmitters on the same fiber sharing the same wavelength by only enabling one transmitter at a time. Burst-mode operation adds complexity to the control loop operation due to the lack of data while BEN is low for the particular transmitter. The control loop must have the ability to either converge during the burst-on time or save the loop state between bursts. Since the minimum burst-on time is on the order of hundreds of nanoseconds and the typical loop time constant is at least an order of magnitude greater, converging during the burst-on time is normally not feasible. Ideally, the loop state should be kept in a dynamic freeze mode, where the digital states (e.g., values $I_0$, $I_1$, Ibias, Imod, as described later in this document) are frozen, but the analog signals (e.g., the input signals to $Filter_{in}$ and $Filter_{ref}$ of the present invention as described later in this document) are preferred to be active to retain the $V_{in}$ and $V_{ref}$ of the present invention at the last known operating point either using the current data input or an approximation of normal data if normal data is not available.

Optical transmitters typically each include a monitor diode which receives a part of the light emitted by the transmitting diode to provide a measure of the optical power levels of the transmitting laser diode. However such monitor diodes and their associated circuitry do not have the high frequency capabilities of the transmitting diode, and accordingly, have real limitations with respect to what the monitor diode can accomplish. In particular, the monitor diode can easily sense the average power $(P_1+P_0)/2$ as very little bandwidth is needed to do so, but in general cannot sense either $P_1$ or $P_0$ unless sufficient consecutive identical digits (CID) are first applied which represents the transmission of all ones for sensing $P_1$ and transmission of all zeroes for sensing $P_0$. While this can be done, it has the disadvantage of requiring the same to be done, typically periodically, so that changes in temperature do not let either value get out of control. This of course provides an undesired interruption of data transmission. Alternatively, a CID detector may be implemented which enables the sensing for $P_1$ or $P_0$ when a sufficient number of CIDs are detected in the data stream. This is costly to implement and may result in too few updates to reliably track the laser behavior. The timely occurrence of such a CID data stream is non deterministic due to the random nature of the data being transmitted. Systems which require periodic occurrence of CIDs are not practical.

Another approach that has been used is to superimpose a relatively low frequency on either the bias current Ibias or on the modulating current Imod, or both, to detect the slope of the optical power curve. The detected laser slope, together with a target extinction ratio, a target average optical power and a measure of the then operating average optical power, can be used to control the values of Ibias and Imod to obtain the desired values of $P_0$ and $P_1$. The problem, however, is that the optical power versus transmitting diode current is not linear, so that applying a fixed slope is, at best, a relatively rough approximation of the actual laser behavior. In that regard, a reasonable error in the value of $P_1$ can be tolerated. However the same magnitude of error in the value of $P_0$ cannot be tolerated because $P_0$ is typically such a small value anyway. The same error in $P_0$ can cause a very large change in the extinction ratio, and may result in an Ibias value below the laser threshold, causing laser relaxation oscillations and unacceptable transmitting laser diode performance.

FIG. 1 is a copy of FIG. 6 from U.S. Patent Application Publication No. 2002/0027690, illustrating a still different way of controlling $P_1$ and $P_0$. In this Figure the outputs on lines 120 and 122 are laser bias control and laser modulation control inputs to the laser driver. In this Figure the current in line 117 from the monitor diode is converted to a voltage by transimpedance amplifier 200, with peak detector 204 sensing the peaks in the monitor diode output and the valley detector 206 sensing the lowest values of the output of the monitor diode. These peaks and valleys are taken as a measure of $P_1$ and $P_0$ which, after processing, provide the laser modulation and laser bias control signals. While this system provides closed loop control, it is highly dependent on the data pattern being transmitted, and depends on the data containing significant strings of all ones and all zeros within a sampling time. It is also dependent on the DC offsets in each control path, which can be substantial, particularly in comparison to the value of $P_0$. U.S. Pat. No. 5,974,063 is similar to this system in some respects.

Other examples of prior art techniques may be found in U.S. Pat. Nos. 5,502,298, 5,535,038, 5,850,409, 6,414,974, 6,807,209, 6,829,267, 6,859,473, 6,907,055, 6,928,094, 6,993,459, 7,088,752, 7,142,574, 7,245,828 and 7,349,454 and U.S. Patent Application Publication Nos. 2005/0226292 and 2009/0310961. Also, equipment for measuring or sensing power levels is also commercially available, such as Agilent Digital Communication Analyzer and Optical Sampling Oscilloscope (86100A/B/C, 86106B, 86107A, 86119A) and Agilent Multi-Channel Power Meter (N7751A, N7752A, N7761A, N7762A, N7764A).

DETAILED DESCRIPTION OF THE PREFERRED EMBODIMENTS

Figure 1:
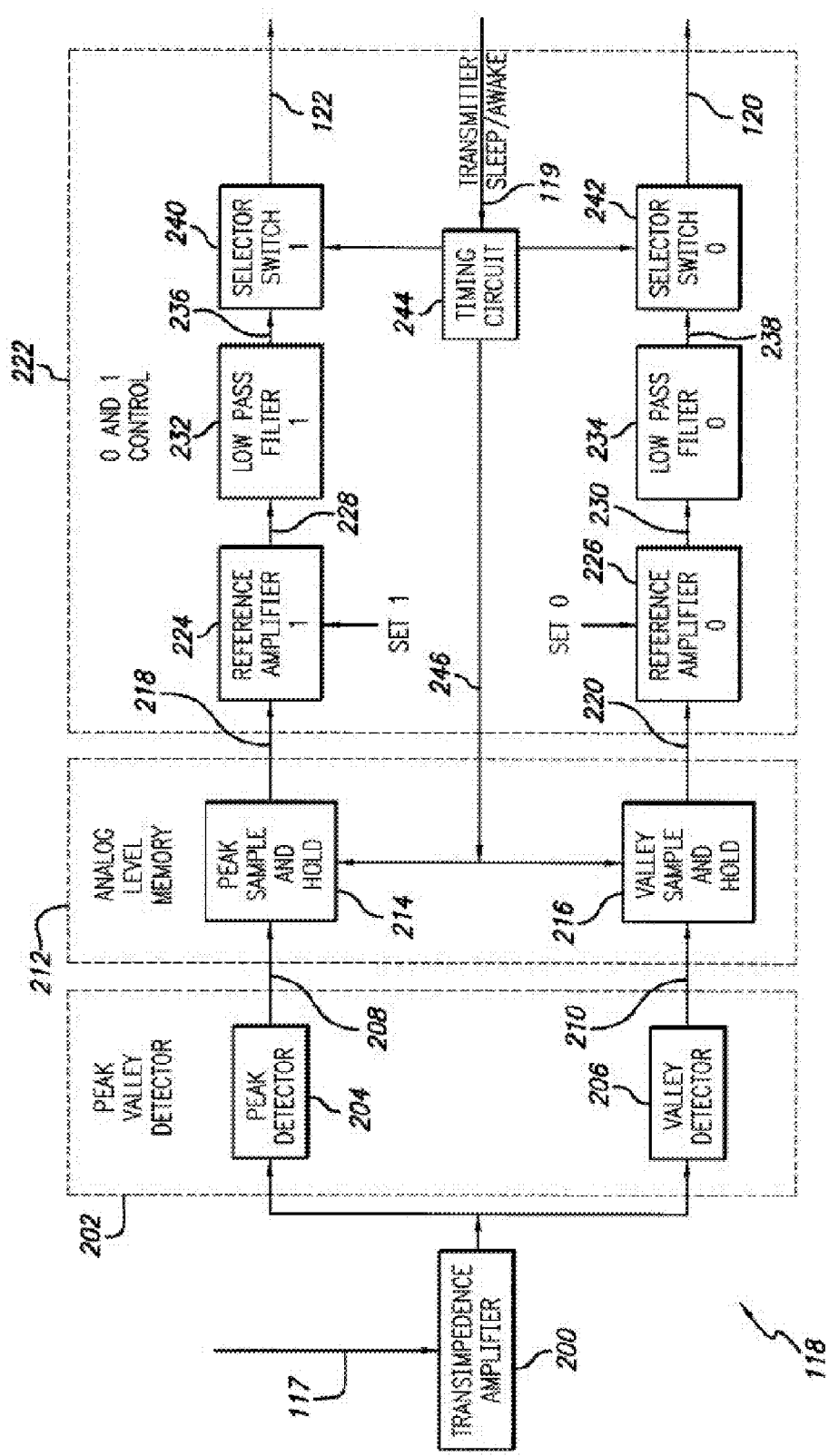
FIG. 1 is a copy of FIG. 6 from U.S. Patent Application Publication No. 2002/0027690.
Figure 2:
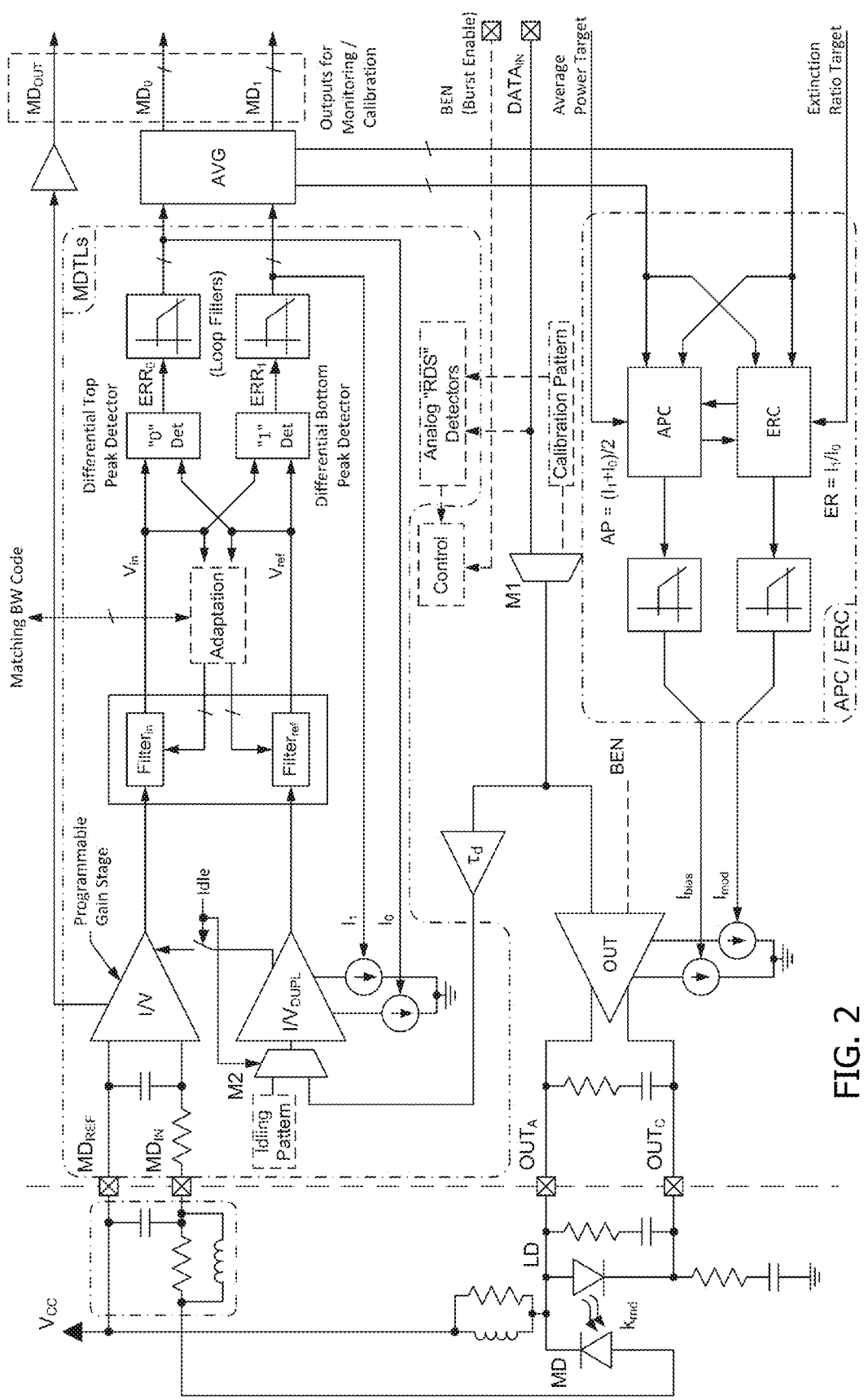
FIG. 2 illustrates burst-mode/continuous monitor diode tracking loops (MDTLs or dynamic differential closed loop estimator).

Now referring to FIG. 2, a block diagram of one embodiment of the present invention may be seen. Assume for the moment that the Burst Enable BEN is on. Accordingly the input data $DATA_{IN}$ is applied through the multiplexer M1 and the AND gate to a transconductance amplifier OUT and to a time delay circuit $\tau_d$. The output of the transconductance amplifier OUT is connected to external circuitry including laser diode LD, the transmitter laser diode for the system. Part of the light emitted by the laser diode LD is coupled to monitor diode MD, which provides a monitor diode output current proportional to the light coupled thereto. This provides an input to the programmable gain stage transimpedance amplifier I/V as one input to the block labeled MDTLs (monitor diode tracking loops). At the same time, the output of the time delay $\tau_d$ is applied to transimpedance amplifier $I/V_{DUPL}$ through multiplexer M2. The transimpedance amplifier $I/V_{DUPL}$ amplifies the time delayed $DATA_{IN}$ signal to provide an output voltage dependent on the values of $I_1$ and $I_0$ fed back thereto, as determined by the state of the $DATA_{IN}$ signal.

The Average Power Target and the Extinction Ratio Target are provided as inputs to the system, specifically to the blocks labeled APC and ERC. These blocks update the laser bias current Ibias and the modulation current Imod, and provide the same to the transconductance amplifier OUT to drive the laser diode LD as previously explained. These currents are adjusted based on the outputs of the monitor diode tracking loops (MDTLs).

The purpose of the monitor diode MDTLs, also referred to as a dynamic differential closed loop estimators, is to provide a measure of the monitor diode output to enable control of the transmitting laser diode LD to achieve target average optical power and extinction ratio. This is done by providing a first signal path for the output of the monitor diode MD and a second path for the delayed $DATA_{IN}$ signal, such that the signal waveforms of the signals $V_{in}$ and $V_{ref}$ match each other. As previously pointed out, the monitor diode output has a much lower bandwidth than the laser diode LD and of course the $DATA_{IN}$ signal. Accordingly for waveform matching, Filter$_{in}$ and Filter$_{ref}$ are provided. In a preferred embodiment these filters are programmable analog filters. Filter$_{in}$ and Filter$_{ref}$ have very different transfer functions, Filter$_{in}$ preferably having some emphasis to extend the rolloff of the monitor diode MD signal out to higher frequencies, with Filter$_{ref}$ providing rolloff so that the frequency response out of Filter$_{ref}$ to the $DATA_{IN}$ signal is the same as the frequency response of the laser diode LD, the monitor diode MD and associated circuitry as provided by Filter$_{in}$.

Also in a preferred embodiment, Filter$_{in}$ and Filter$_{ref}$ are both programmable filters which are programmed through an adaptation circuit provided with a matching BW code and in addition, which adaptation circuit senses the frequency content of the two signals and adjusts the filters accordingly to match the frequency content of the two paths. The differential top peak detector detects the peak values (upper excursions) of each of the two signals $V_{in}$ and $V_{ref}$ and provides an output signal $ERR_0$ based on a comparison of these two low values. Similarly the differential bottom peak detector detects the low peak values (lower excursions) in each of the two signals $V_{in}$ and $V_{ref}$ and provides a signal $ERR_1$ based on a comparison of those two peaks. The differential top peak detector is labeled "0" Det and the differential bottom peak detector is identified by "1" Det in FIG. 2 as, since the transimpedance amplifiers I/V and $I/V_{DUPL}$ invert the signals, the peaks are sensed relative to VCC as opposed to ground, and accordingly the peak detectors are labeled in reverse of what one would expect.

The output of the peak detectors is accumulated in the loop filters and fed back to control the currents $I_1$ and $I_0$ for the transimpedance amplifier $I/V_{DUPL}$. Thus the values of $I_1$ and $I_0$ fed back to the transimpedance amplifier $I/V_{DUPL}$ will settle out at values for which the differential top peak detector and the differential bottom peak detector sense the corresponding peaks in $V_{in}$ and $V_{ref}$ as being equal. This feedback loop, actually controlling two values, will be referred to herein as the $I_1$, $I_0$ loop. In this condition those feedback currents $I_1$ and $I_0$ are a good measure of the then existing monitor diode MD output corresponding to the optical power outputs $P_1$ and $P_0$ of the transmitting laser diode LD.

Accordingly, the circuit labeled AVG can average a number of the values of $I_1$ and $I_0$ to determine and provide monitor diode outputs $MD_1$ and $MD_0$ for system tracking. These are digital outputs, in multibit form.

The currents $I_1$ and $I_0$ which are proportional to $P_1$ and $P_0$ are then fed back to the APC and ERC blocks for comparison with the average power target and the extinction ratio target. Assuming that the $I_1$,$I_0$ loop has settled on average values of $I_1$ and $I_0$ which do not meet the average power target and extinction ratio target, a calculated adjustment is made in Ibias and Imod. This changes the drive on the laser diode LD and thus the output of the monitor diode MD, requiring the $I_1$,$I_0$ loop previously described to settle on new values of $I_1$ and $I_0$. The loop including the feedback of values $I_1$ and $I_0$ adjust the transmitting laser diode LD drive will be referred to herein as the Ibias,Imod loop. After the $I_{bias}$, $I_{mod}$ loop settles on new values, the feedback from the AVG block to the APC and ERC blocks is again compared with the values determined from the average power target and the extinction ratio target to make further adjustments in the values of Ibias and Imod, as required.

Accordingly, the system will start with initial values of Ibias and Imod, then allow the $I_1$,$I_0$ loop to stabilize at steady or average values of $I_1$ and $I_0$ as fed back to the $I/V_{DUPL}$ transimpedance amplifier, after which those values or some values proportional thereto are fed back in the Ibias,Imod loop to be compared with values determined by the average power target and extinction ratio target inputs, from which the entire sequence is repeated using new values for Ibias and Imod based on calculated adjustments expected to best correct the feedback signal to match the corresponding signals determined by the average power target and the extinction ratio target. Thus, particularly through the use of multibit signals, convergence of the system to the commanded average power target and extinction ratio target is achieved without measuring the actual $P_1$ and $P_0$ values.

Thus from the foregoing it can be seen that in certain preferred embodiments, from the matching of the waveform for the signals $V_{in}$ and $V_{ref}$, the relative highs and lows of the signals can be made equal through the feedback of $I_1$ and $I_0$ to the amplifier $I/V_{DUPL}$ while the values of Ibias and Imod are held fixed. These values then are directly or indirectly used for comparison with values determined from the average power target and the extinction ratio target to update the Ibias and Imod values to adjust the drive for the laser diode LD and the process is repeated. In one embodiment, once the $I_1,I_0$ loop settles, its output is sampled a number of times and averaged before being fed back to the Ibias,Imod loop. Also as shall subsequently be described in greater detail, some monitoring of the data is effectively done so that the repeated settling of the $I_1,I_0$ loop is done using data strings of some selected characteristics, or by giving more weight to more "favorable" data strings, as the excursion of the monitor diode output to a data string of alternate ones and zeros probably will not be enough to provide good results. Also, the then current values of $I_1$ and $I_0$ are retained between bursts and reinstated after each burst, so that in the case of repeated short bursts, any one settling of the $I_1,I_0$ loop could actually span or carry over to multiple bursts.

Referring again to FIG. 2, during the time between bursts, if external data at $DATA_{IN}$ is not available, an idling pattern is provided through multiplexer M2 to the transimpedance amplifier $I/V_{DUPL}$ and through a switch to the output of transimpedance amplifier I/V. This causes both amplifiers to have the same output, which in turn allows the zeroing of offsets in the signal paths using conventional offset correction techniques. It also maintains the analog circuitry, specifically the inputs to $Filter_{in}$ and $Filter_{ref}$ and resulting $V_{in}$ and $V_{ref}$ signals, in an active state for fast recovery when the burst returns. Also shown in FIG. 2 is some external circuitry connected to the transmitting diode LD and the monitor diode MD, which may vary with laser diode type. Its function, however, is to provide a virtual ground at the common connection between the laser diode LD and the monitor diode MD so that the electrical drive to the laser diode does not couple over to the monitor diode to give a false indication of light impinging thereon. Also shown in FIG. 2 is an analog output $MD_{OUT}$, which mirrors the monitor diode output for the user to use for tuning the system.

Thus if $P_1$ and $P_0$ are known, everything with the exception of $K_{MD}$, the optical coupling between the laser diode LD and the monitor diode MD, is known. The tracking loops generating $I_1$ proportional to $P_1$ and $I_0$ proportional to $P_0$ provide results that remain accurate with minimum data bursts. External passive networks are optimized for each transmitter optical subassembly type. Good optical transmitter output and monitor diode feedback can be achieved simultaneously using $MD_{OUT}$ as an observable signal. Built-in calibration hooks are also provided, such as the calibration pattern generator shown in FIG. 2, to reduce manufacturing costs significantly. The automatic calibration further described in FIG. 7 enables extinction ratio calibration without the need for an expensive sampling oscilloscope, which introduces additional error (due to offsets in the optical-to-electrical converter unit) in a production environment especially at very high extinction ratios as required by PON standards. Depending on the laser diode type and monitor diode type used, the required matching BW code may vary with temperature, though the number of codes required to cover any conventional temperature range will be quite limited and the temperature look-up table will not require changes for individual modules using the same type of laser diode and monitor diode. Further, and probably most importantly, calibration may be done at one temperature only and adequate performance achieved over a reasonably wide operating temperature range with no calibration over the temperature range being required on an individual transmitter optical subassembly basis. Accordingly the characterization of the optical transmitter subassembly type may be done on a one time basis and repeatedly used in production for calibration at a single temperature.

Figure 3:
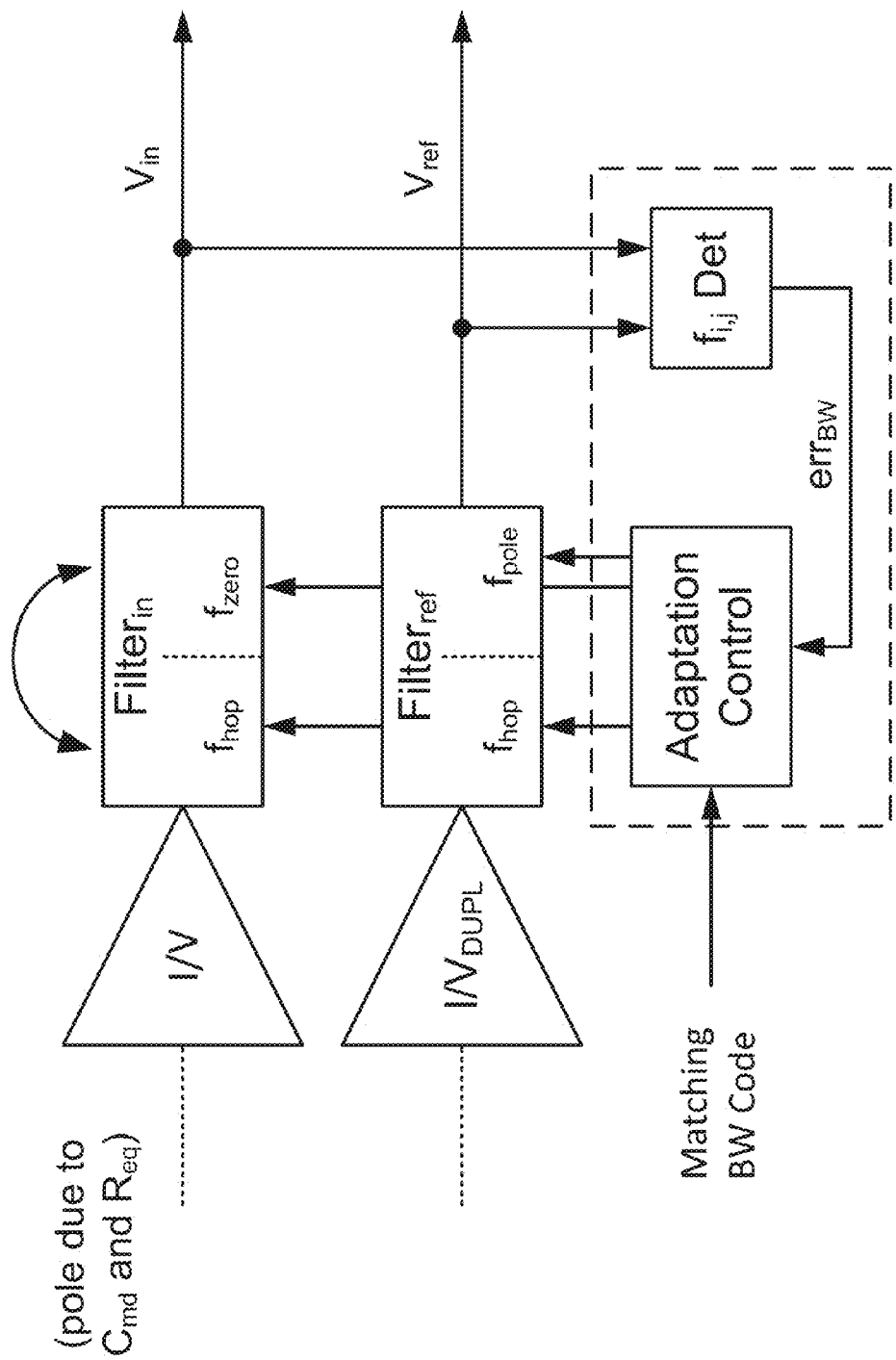
FIG. 3 illustrates MDTL BW matching.

Now referring to FIG. 3, a portion of FIG. 2 shown in somewhat greater detail may be seen. The goal of the circuits, and particularly the filters $Filter_{in}$ and $Filter_{ref}$, is to make $V_{in}$ and $V_{ref}$ have the same transient behavior. Since there is no need for an open data eye, there is one more degree of freedom to optimize for the signal to interference ratio. The $f_{zero}$ level can be any value between zero and the full compensating value for $f_{pole}$ (monitor diode capacitance Cmd and $MD_{in}$ equivalent input resistance Req), while the higher-order pole ($f_{hop}$) is used to remove higher-order mismatch components. The adaptation can be used to compensate for voltage and temperature variation, though if not used, the matching BW code can be used directly to control $f_{hop}$ and $f_{zero}/f_{pole}$. The transimpedance stages for the input and reference paths and the associated filters can be implemented in various combinations.

Figure 4:
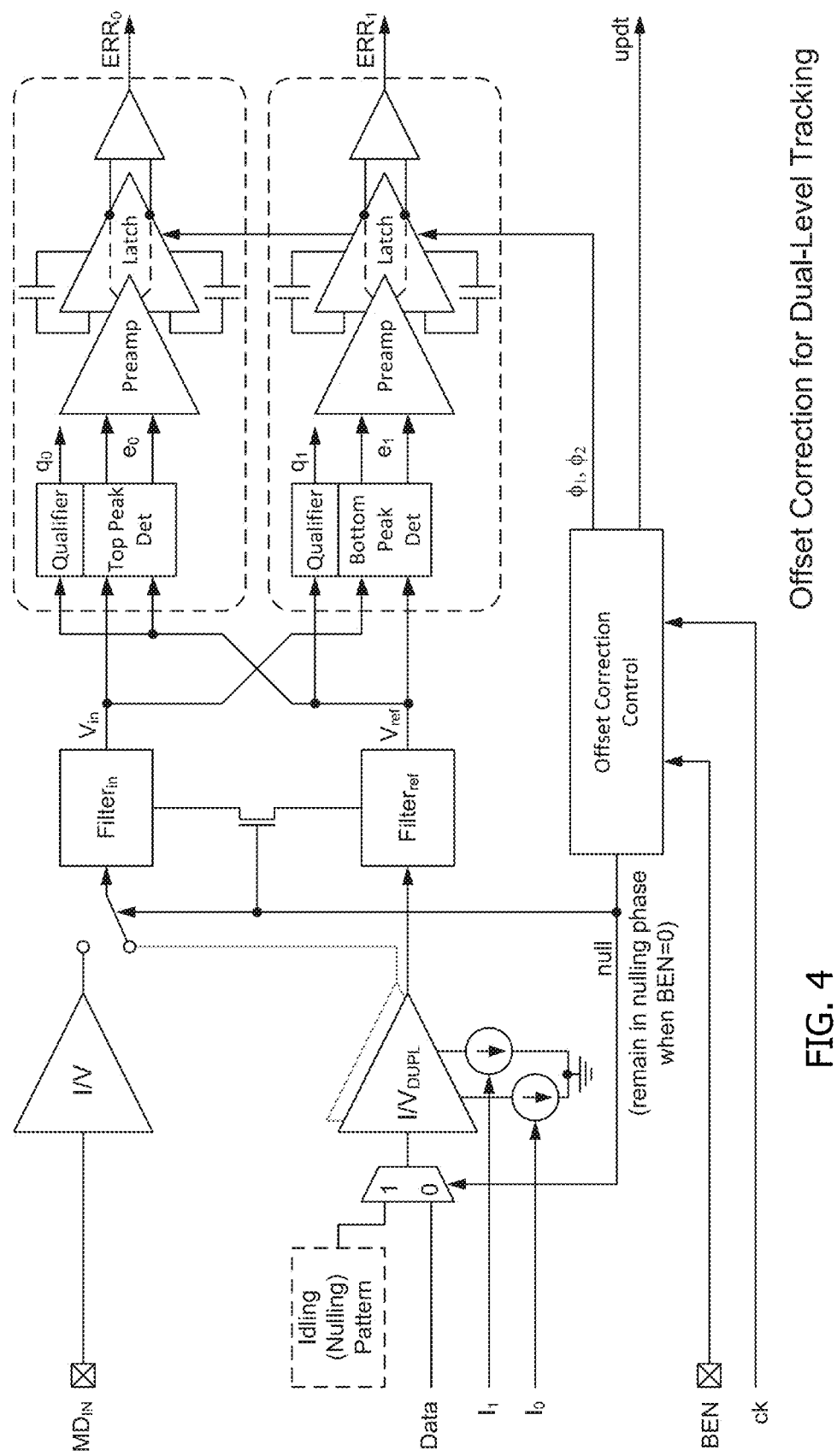
FIG. 4 illustrates MDTL offset correction.

The offset correction is shown in greater detail in FIG. 4. Here, two phase dynamic differential offset correction is shown, namely, nulling and tracking. Since the two paths have the same input during nulling (which occurs between bursts and regularly during bursts), the errors $ERR_0$ and $ERR_1$ can be detected at the input of the Preamps, including the offsets of the Preamps themselves, and removed during the tracking phase. The idling or nulling data pattern keeps all circuits active and dynamically balanced at the last known conditions during the nulling phase, during which all offsets are cancelled out. While output storage is shown, auxiliary input storage can also be used. As previously pointed out, in the burst off state the system state ($I_1$, $I_0$, Ibias and Imod) is saved, waiting for the next burst.

Figure 5:
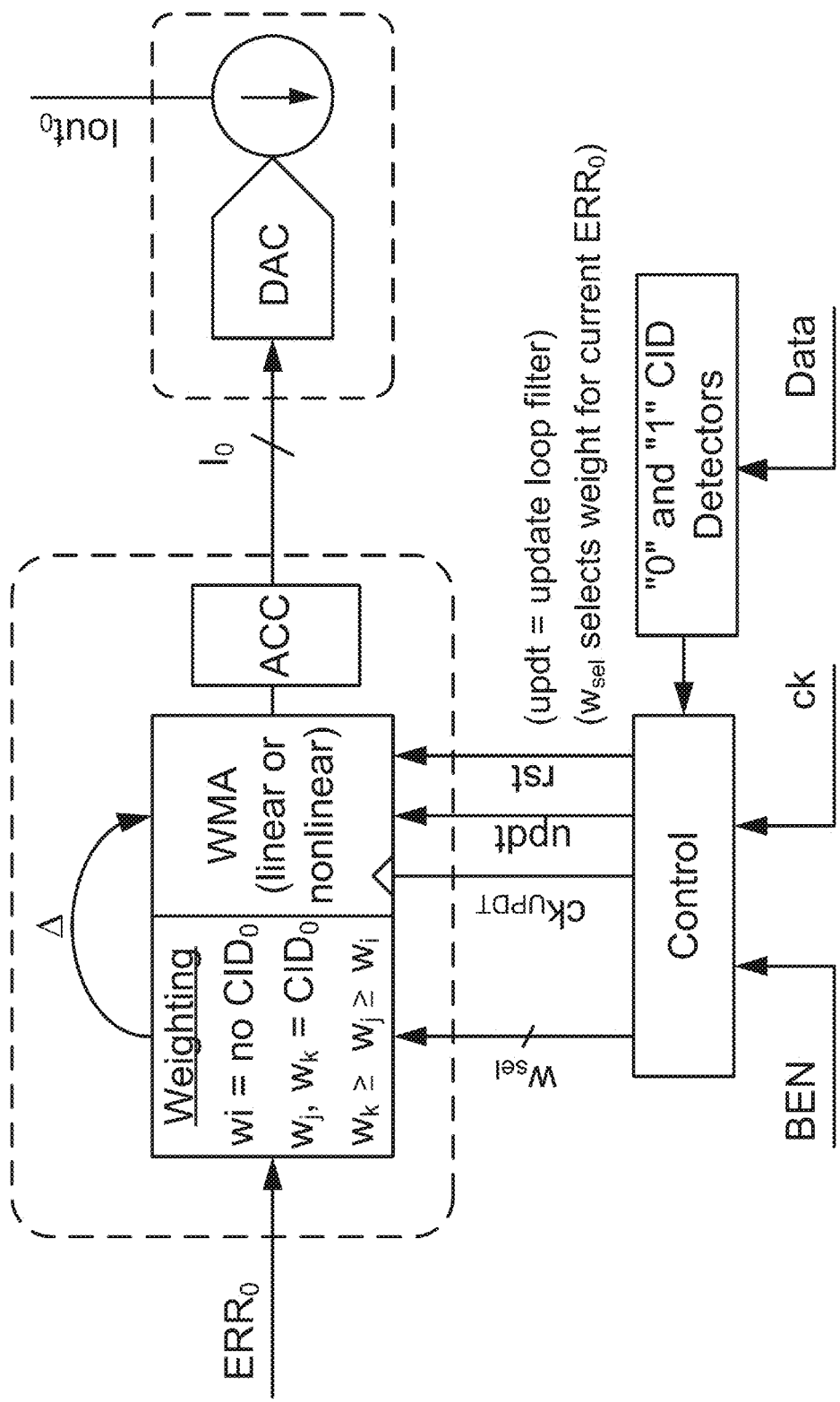
FIG. 5 illustrates MDTL loop filters.

Now referring to FIG. 5, further enhancements can be made the system. One enhancement is to use a weighted moving average (WMA) with a CID (consecutive identical digit) detector to control weighting based on sensed CID of the transmit signal. Weights can be optimized based on input statistics and matched bandwidth. One example of CID weighting is 0-2 bit CID for $W_i$; 3-bit CID for $W_j$; 6-bit CID for $W_k$. The simplest form of weighting is $W_k=W=W_i$-unweighted, so there is no need for CID detectors. When Burst Enable BEN is off, there is no data and no update. Alternatively, one could use a long CID put in specifically for this purpose, though that is not preferred because of its use of some dedicated transmission time.

Figure 6:
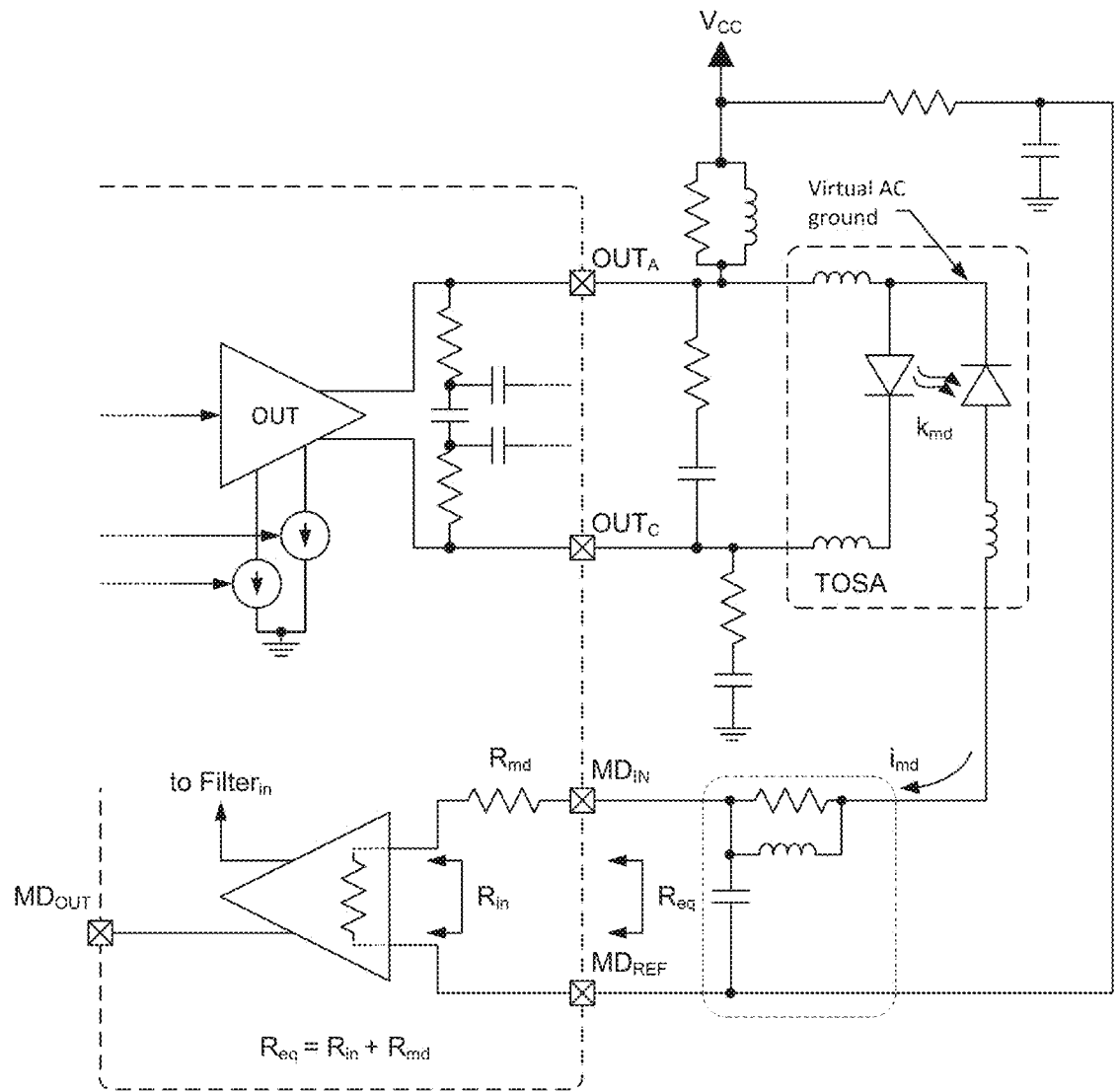
FIG. 6 illustrates TOSA virtual ground.

FIG. 6 illustrates tuning for virtual ground. $MD_{out}$ is available along with optical output eye for tuning multiple external components for each TOSA configuration (not for each individual TOSA). The filtering components are not implemented on-chip to provide tuning flexibility for different TOSA configurations. The virtual ground minimizes the loading of monitor diode MD capacitance on the laser diode LD, and the virtual ground also minimizes the electrical interference from the laser diode LD to the monitor diode MD signal path. One possible configuration is shown which allows independent tuning of anode and cathode to compensate for internal inductance of the TOSA.

Figure 7:
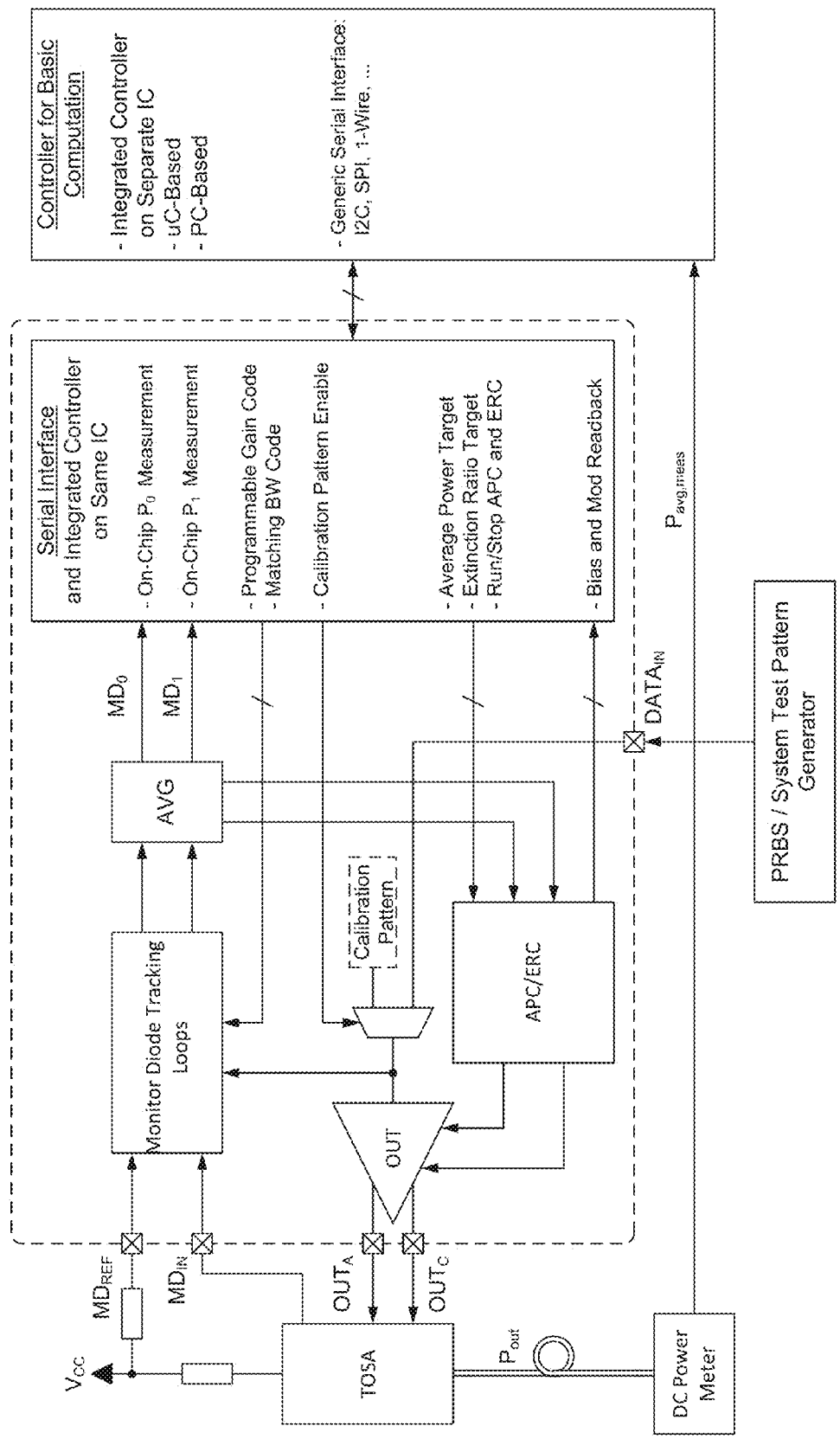
FIG. 7 illustrates system calibration.

FIG. 7 illustrates the complete system calibration at one temperature with no expensive equipment. Only a DC optical power meter is needed. A PRBS (Pseudo Random Bit Sequence) input pattern can be generated on chip. An integrated/controller-based test system can be used to perform write/read operations and basic computations for calibration. The calibration consists of two phases: average power calibration and extinction ratio calibration. A programmable gain code and average power target, along with the DC Power Meter, are used to complete the average power calibration. The average power calibration procedure is as follows: 1) enable the calibration pattern; 2) write average power and extinction ratio targets; 3) start APC and ERC loops; and 4) read optical power meter output $P_{avg,meas}$ and adjust the Programmable Gain Code and Average Power Target to achieve desired $P_{avg,meas}$. The extinction ratio calibration procedure differs slightly between the embodiments of FIG. 2 and FIG. 10. For the first embodiment of FIG. 2 and FIG. 9, the procedure is as follows: 1) at the end of the average power calibration, stop the APC and ERC loops so Ibias and Imod are frozen at their present values; 2) read $MD_0$ and $MD_1$ target values $MD_{0,target}$ and $MD_{1,target}$ and store; 3) input PRBS/system test pattern and read $MD_0$ and $MD_1$; and 4) adjust Matching BW code until $MD_0$ and $MD_1$ match $MD_{0,target}$ and $MD_{1,target}$. For the embodiment of FIG. 10, the procedure is as follows: 1) at the end of the average power calibration, stop the APC and ERC loops so Ibias and Imod are frozen at their present values; 2) switch multiplexer M1 in FIG. 10 to route $IM_0$ and $IM_1$ to $I_{0,IN}$ and $I_{1,IN}$; 3) read $MD_0$ and $MD_1$ target values $MD_{0,target}$ and $MD_{1,target}$; 4) input PRBS/system test pattern and read $MD_0$ and $MD_1$; and 5) adjust Matching BW code until $MD_0$ and $MD_1$ match $MD_{0,target}$ and $MD_{1,target}$. The extinction ratio calibration may be performed entirely on-chip or with the aid of the serial interface and a controller or PC. In this way, the average power and extinction ratio are calibrated without the use of an external oscilloscope.

Figure 8:
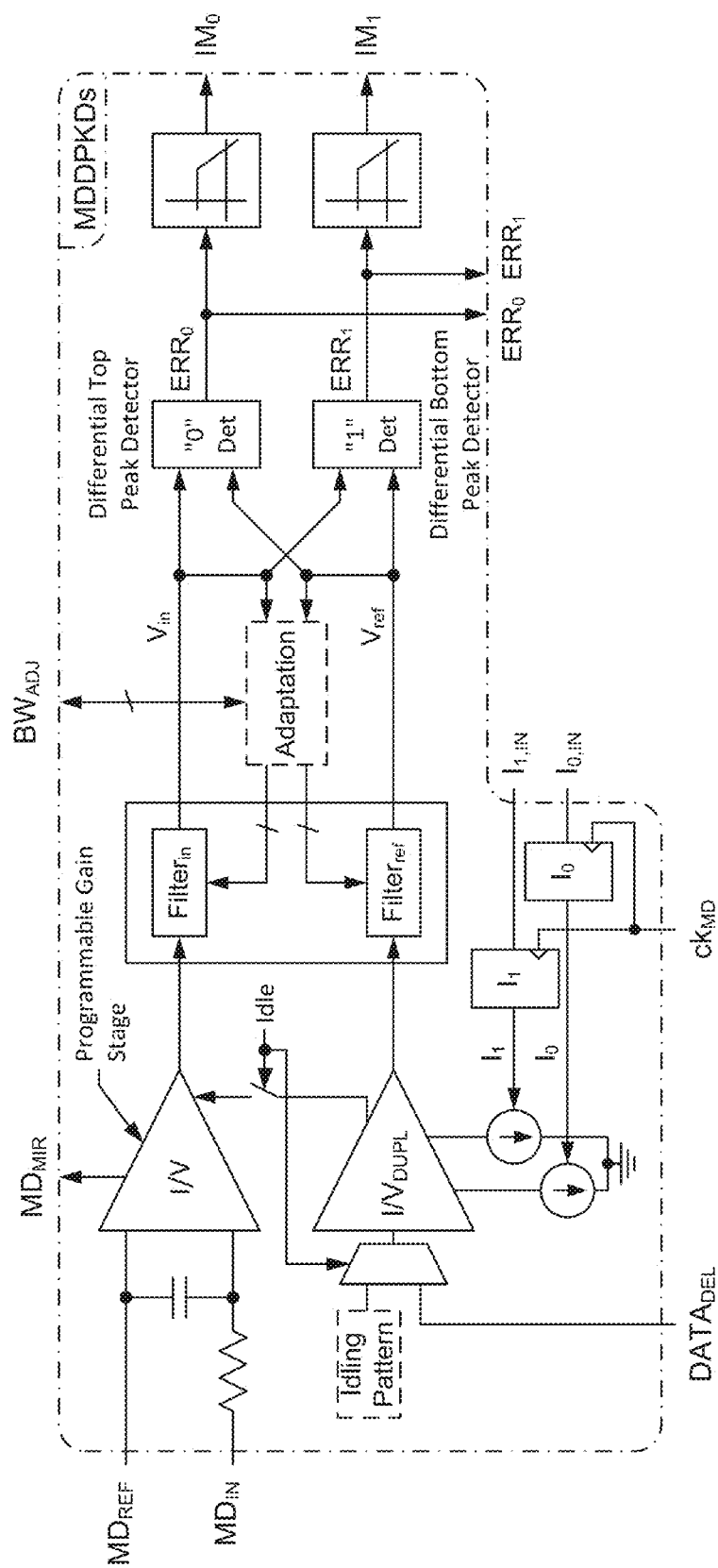
FIG. 8 illustrates a circuit element which may be used with the embodiments of FIGS. 9 and 10.
Figure 9:
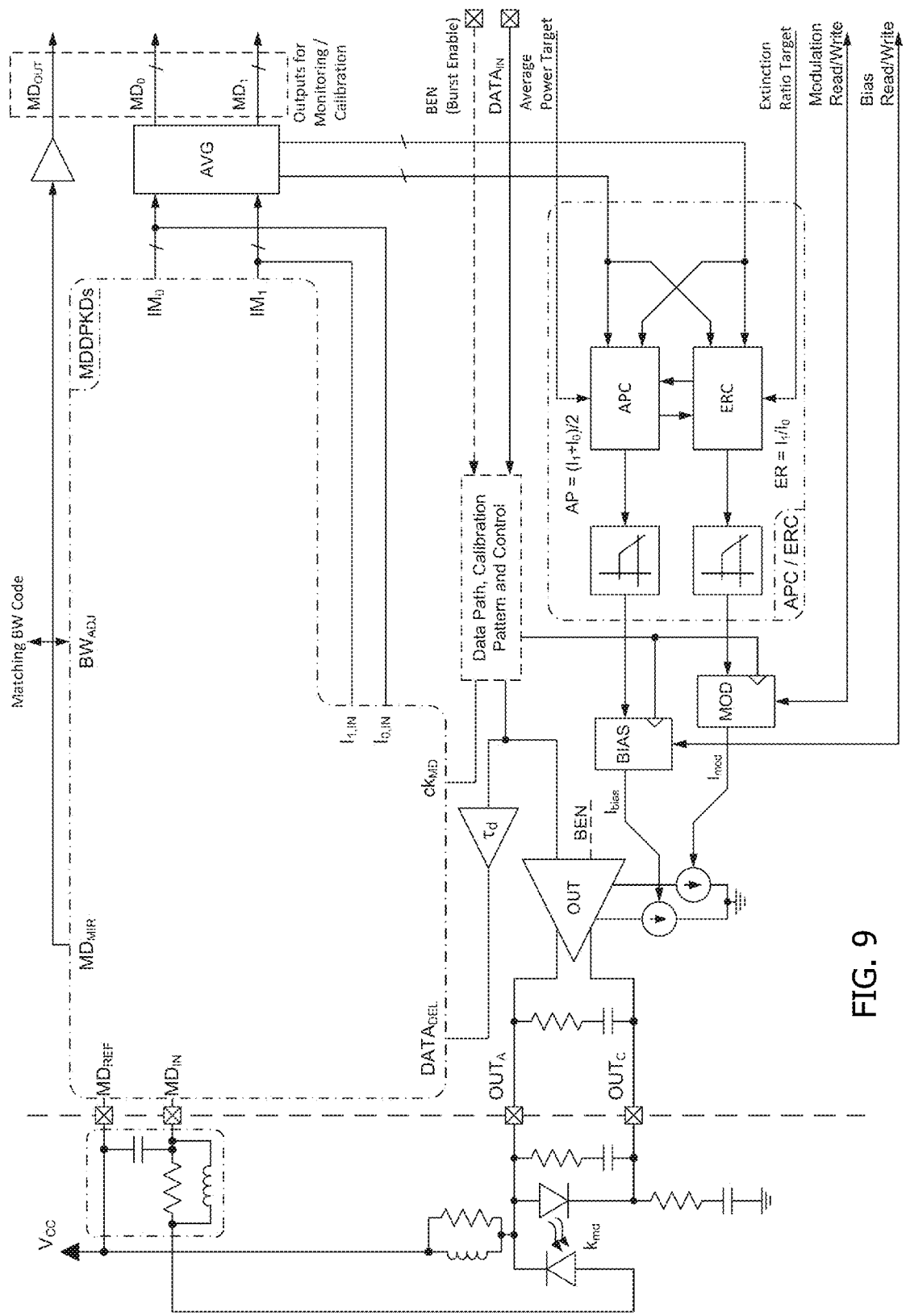
FIG. 9 utilizes the circuit of FIG. 8 to substantially replicate the circuit of FIG. 2.
Figure 10:
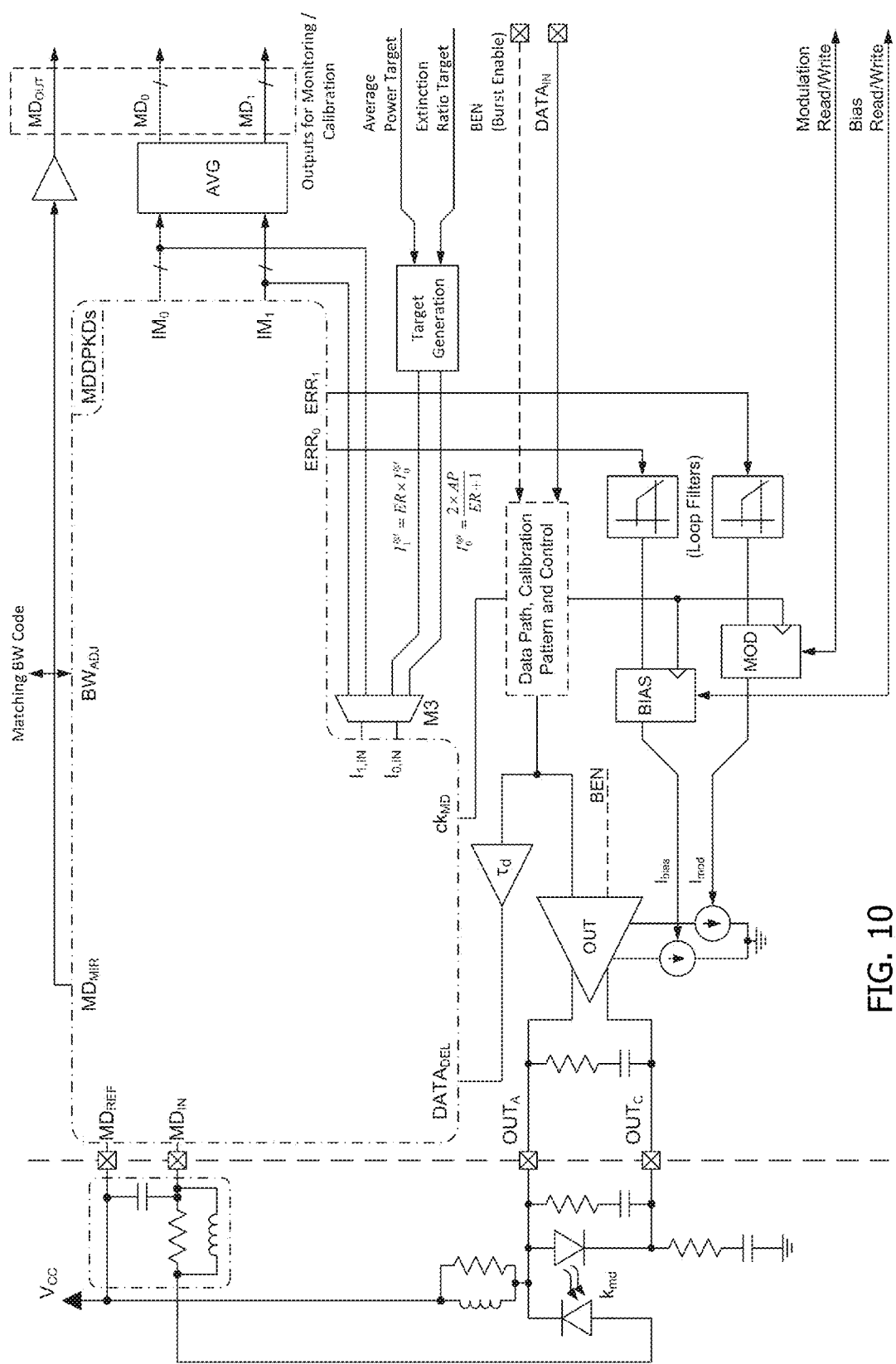
FIG. 10 uses the circuit of FIG. 8 but in a different embodiment of the invention.

Now referring to FIG. 8, a circuit element which may be used with the embodiments of FIGS. 9 and 10 may be seen. This is basically a portion of FIG. 2 within a similar dashed line, though the analog output of the monitor diode output labeled $MD_{OUT}$ in FIG. 2 is effectively labeled $MD_{MIR}$, as the monitor diode output is provided from a mirror in the programmable gain stage I/V. Similarly, the input for the matching bandwidth code of FIG. 2 is labeled $BW_{ADJ}$ and $I_1$ and $I_0$ for the current sources of the transimpedance amplifier $I/V_{DUPL}$ in FIG. 2 are identified as $I_{1,IN}$ and $I_{0,IN}$, with latches $I_1$ and $I_0$ being clocked by the signal $ck_{MD}$.

FIG. 9 utilizes the circuit of FIG. 8 to substantially replicate the circuit of FIG. 2. However FIG. 10 uses the circuit of FIG. 8 but in a different way. In particular, as may be seen therein, the average power target and the extinction ratio target are both provided to a target generation block which generates $I_1^{tgt}$ and $I_0^{tgt}$ in accordance with the following equations.

$$I_1^{tgt} = ER \times I_0^{tgt}$$

$$I_0^{tgt} = \frac{2 \times AP}{ER + 1}$$

During a burst, these target values are provided through multiplexer M3 as the inputs $I_{1,IN}$ and $I_{0,IN}$. Because these currents are effectively forced by the target values, the signals Vin and Vref (FIG. 8) will not match until such time as the currents Ibias and Imod match the target values. Accordingly the signals $ERR_0$ and $ERR_1$ are accumulated by the loop filters and applied through the latches BIAS and MOD, driving Ibias and Imod to the target values of Ibias and Imod. Accordingly in this embodiment there is effectively only a single loop which is adjusting the two parameters Ibias and Imod to achieve the average power target and the extinction ratio target. As before, values of Ibias and Imod are frozen or stored between bursts, so that at the beginning of the next burst, the system is restored to its state at the end of the last burst. As with the previous embodiment, Ibias and Imod may be read out by the user or the system, and may also be forced to particular values externally or by the system.

Figure 11:
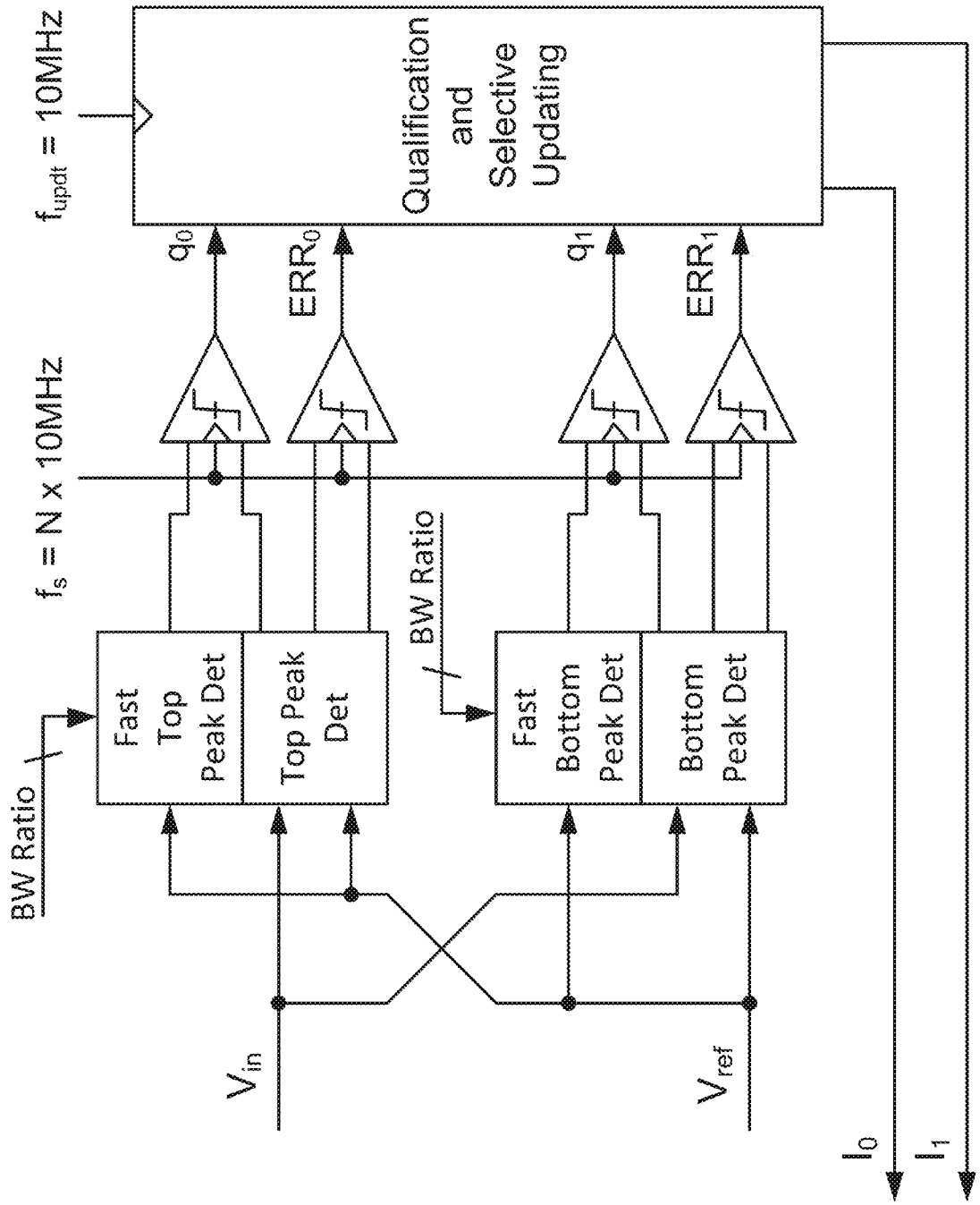
FIG. 11 illustrates the addition of fast peak detectors for sensing desired strings in random data.

It was previously mentioned that some monitoring of the data is effectively done so that the repeated settling of the $I_1$,$I_0$ loop is done using data strings of some selected characteristics, or of different weights, as the excursion of the monitor diode output to a data string of alternating ones and zeros at high data rates probably will not be enough to provide good results. Similarly, unlike some prior art which depends on long strings of all 0s and all 1s to measure $P_0$ and $P_1$, the present invention responds best to random data that will have typically much more limited "continuous" data strings. In particular, in one embodiment, additional peak detectors are employed in parallel with the top and bottom peak detectors of FIGS. 2, 4 and 8, namely "fast" peak detectors as shown in FIG. 11, and may be connected to either the $V_{in}$ signal or the $V_{ref}$ signal. These peak detectors are faster (respond to higher frequencies, i.e., frequencies at higher data rates) than the peak detectors previously described, so that they will respond faster to short strings of all 0s and all 1s than the slower peak detectors in parallel therewith. Thus by comparing the outputs of the two top peak detectors and comparing the outputs of the two bottom peak detectors, short strings of 0and 1s can be detected. In FIG. 11, the Fast Top Peak and Fast Bottom Peak Detectors use Vref as their input, with the outputs of the Fast Top Peak and Fast Bottom Peak Detectors being compared with the outputs of the Top Peak and Bottom Peak Detectors for the Vref signal, respectively. Alternatively, the Fast Top Peak and Fast Bottom Peak Detectors could use Vin as their input, with the outputs of the Fast Top Peak and Fast Bottom Peak Detectors being compared with the outputs of the Top Peak and Bottom Peak Detectors for the Vin signal.

Figure 12:
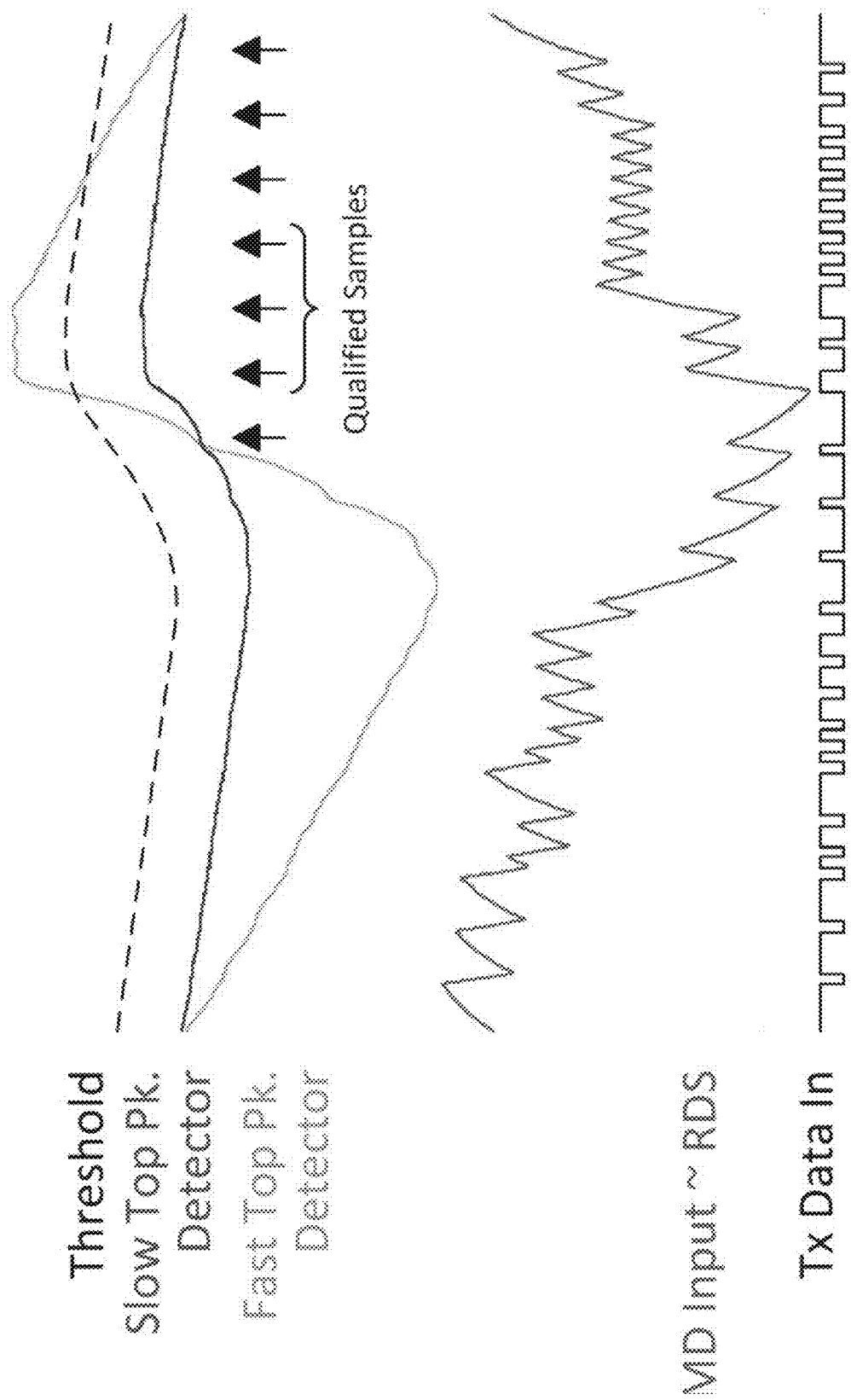
FIG. 12 illustrates the use of the fast peak detectors of FIG. 11.

Long strings of CIDs are not necessary; only a high "average" value or a low "average" value is required to qualify a sample. This is illustrated in FIG. 12, which illustrates the establishment of a threshold in the difference in response of the top peak detectors required for the system to respond to the peak detector output. The same concept is applied to the bottom peak detectors, with the outputs $q_0$ and $q_1$ providing the indication (qualification) that the thresholds have been met, so that the system may respond to the corresponding signals $ERR_0$ and $ERR_1$. Note the inversion between the MD Input and the peak detector signals, as discussed previously. The difference in response of the peak detectors may be set by the setting the bandwidth ratio BW Ratio, as may be seen in FIG. 11. In one embodiment, the qualifier and clocking is at a rate of 320 MHz, while the update clocking is at a rate of 10 MHz.

There has been described herein a dual laser-power-level control and calibration system for burst-mode and continuous-mode transmitters that uses what can be called an estimator in one or two closed loops to estimate and set the P0 and P1 power levels for the transmitting laser based on the output of a monitor diode and control inputs of average power level and extinction ratio. The estimator does not require any specific form of input data pattern, but instead can continually estimate and correct P0 and P1 power levels of the laser using NRZ coded transmitted data. For burst mode operation, the state of the dual laser-power-level control and calibration system is retained between bursts, and in addition, the estimator is kept active using an idling pattern so that settling at the beginning of a burst is substantially immediate.

The output of the monitor diode contains four pieces of information, namely, the data being transmitted, the monitor diode bandwidth, the high or P1 power level of the transmitting diode and the low or P0 power level of the transmitting diode. In the estimator, the monitor diode output is processed in a first signal path, and the input data is processed in a second signal path. The monitor diode has a much lower bandwidth than the transmitting diode (and data being transmitted), though the two signal paths each include a filter so that the bandwidth of the signals in the two signal paths after the filters is the same (but lower than the data itself). A differential peak detector detects the difference in the top peaks of the signals in the two signal paths to provide a first error signal ($ERR_0$), and a second differential peak detector detects the difference in the bottom peaks of the two signals to provide a second error signal ($ERR_1$). These differential peak detectors are dynamic in the sense that they are continuously comparing peaks and providing error signals responsive to the comparisons, regardless of the magnitude of the peaks. Thus the dynamic differential peak detectors are operating continuously comparing a transmit data signal with a monitor diode signal, both of which are active signals, as opposed to depending on any CID (consecutive identical digits) for comparison with a DC reference. An idling pattern is used to maintain dynamic operating points during the absence of input data, and offset correction is provided to correct for offsets that otherwise would create comparison errors.

In one embodiment, the error signals pass through loop filters and are fed back to a transimpedance amplifier in the data signal path of the estimator to provide an output voltage of the transimpedance amplifier dependent on the values fed back thereto, as determined by the state of the $DATA_{IN}$ signal. This forms a first or inner feedback loop.

When the first feedback loop settles, the feedback signals are proportional to the transmit diode power levels, and are coupled (or averages or weighted averages thereof are coupled) to a circuit that compares the feedback signals with corresponding calculated desired transmit diode power levels based on inputs of average power values and extinction ratio. This forms a second or outer feedback loop. If the transmit diode is not operating at the calculated power levels, the transmit diode power levels are adjusted, and the process is repeated by letting the first feedback loop settle again with the new values of the monitor diode output, etc.

In another embodiment, calculated values proportional to the desired power levels based on inputs of average power level and extinction ratio are provided to the transimpedance amplifier in the data signal path of the estimator to set the desired power levels in the data signal path, and the resulting error signals are coupled to loop filters and then used to adjust the power levels of the transmit diode. Thus in this embodiment, there is a single feedback loop that settles to the desired transmit diode power levels. Of course in any embodiment, obvious minor changes may be made to accommodate inputs defining the desired power levels other than average power and extinction ratio, such as, by way of example, inputs indicative of the desired power levels themselves. The preferred embodiments described herein have been described with respect to the use of laser diodes as the transmit diodes, though any optical transmitter may be used, laser diodes being only one example of an optical transmitter.

Thus the present invention has a number of aspects, which aspects may be practiced alone or in various combinations or sub-combinations, as desired. While certain preferred embodiments of the present invention have been disclosed and described herein for purposes of illustration and not for purposes of limitation, it will be understood by those skilled in the art that various changes in form and detail may be made therein without departing from the spirit and scope of the invention as defined by the full breadth of the following claims.

What is claimed is:

1. A method of controlling the power levels of an optical transmitter comprising:
    providing a first signal path for receiving and filtering a transmit signal also used to control the optical transmitter, the first signal path including a first amplifier providing a first output representing a first logic state responsive to the transmit signal and a first level control signal, and a second output representing a second logic state responsive to the transmit signal and a level control signal;
    providing a second signal path for receiving and filtering a signal from a monitor diode monitoring the emission of the optical transmitter;
    the transmit signal as filtered in the first signal path tracking a frequency response of the monitor diode signal as filtered in the second signal path;
    differentially comparing the outputs of a first differential peak detector, the upper excursions of the transmit signal as filtered in the first signal path and the monitor diode signal as filtered in the second signal path to create a first error signal, and differentially comparing the outputs of a second differential peak detector, the lower excursions of the transmit signal as filtered in the first signal path and the monitor diode signal as filtered in the second signal path to create a second error signal;
    using the first and second error signals to adjust a high optical power level and a low optical power level of the optical transmitter to achieve a target average optical power level and extinction ratio.

2. The method of claim 1 wherein multiple comparisons between the upper excursions of the transmit signal as filtered in the first signal path and the monitor diode signal as filtered in the second signal path and multiple comparisons between the lower excursions of the transmit signal as filtered in the first signal path and the monitor diode signal as filtered in the second signal path are combined to achieve a target average optical power level and extinction ratio.

3. The method of claim 2 wherein some comparisons are given more weight than other comparisons based on different data strings.

4. The method of claim 3 wherein different data strings are detected by consecutive identical digit detectors.

5. The method of claim 4 wherein the consecutive identical digit detectors separately detect consecutive identical digits of a first logic state and consecutive identical digits of a second logic state.

6. The method of claim 3 wherein the data strings are detected by:
comparing the upper excursion of the transmit signal as output by the first differential peak detector with an output of a third peak detector having a higher frequency response than the first differential peak detector, the third peak detector detecting the upper excursion of the transmit signal as filtered in the first signal path; and
comparing the lower excursion of the transmit signal as output by the second differential peak detector with an output of a fourth peak detector having a higher frequency response than the second differential peak detector, the fourth peak detector detecting the lower excursion of the transmit signal as filtered in the first signal path;
or
comparing the upper excursion of the monitor diode signal as output by the first differential peak detector with an output of a third peak detector having a higher frequency response than the first differential peak detector, the third peak detector detecting the upper excursion of the transmit signal as filtered in the first signal path; and
comparing the lower excursion of the transmit signal as output by the second differential peak detector with an output of a fourth peak detector having a higher frequency response than the second differential peak detector, the fourth peak detector detecting the lower excursion of the transmit signal as filtered in the first signal path.

7. The method of claim 3 wherein the data strings are detected by:
comparing the upper excursion of the transmit signal as output by the first differential peak detector with an output of a third peak detector having a higher frequency response than the first differential peak detector, the third peak detector detecting the upper excursion of the transmit signal as filtered in the first signal path; and
comparing the lower excursion of the transmit signal as output by the second differential peak detectors with an output of a fourth peak detector having a higher frequency response than the second differential peak detectors, the fourth peak detector detecting the lower excursion of the transmit signal as filtered in the first signal path.

8. The method of claim 1 wherein a measure of the comparisons of the upper excursions of the transmit signal as filtered in the first signal path and the monitor diode signal as filtered in the second signal path and a measure of the comparisons of the lower excursions of the transmit signal as filtered in the first signal path and the monitor diode signal as filtered in the second signal path are fed back as feedback signals to the first amplifier in the first signal path as the first and second level control signals.

9. The method of claim 8 further comprising monitoring signal outputs responsive to the feedback signals as being indicative of the high optical power level and the low optical power level of the optical transmitter.

10. The method of claim 8 wherein signals responsive to the feedback signals are also used to set the power levels of the optical transmitter.

11. The method of claim 8 wherein signals responsive to averages of the feedback signals are also used to set the power levels of the optical transmitter.

12. The method of claim 8 wherein signals responsive to the averages of feedback signals are used to adjust the power levels to be provided to the optical transmitter relative to calculated values of optical transmitter power levels from inputs of target average optical power level and extinction ratio.

13. The method of claim 8 wherein signals responsive to the feedback signals are used to adjust the power levels to be provided to the optical transmitter relative to calculated values of optical transmitter power levels from inputs of target average optical power level and extinction ratio.

14. The method of claim 8 wherein between bursts, the optical transmitter power levels at the end of a prior burst are retained for use at the start of a next burst.

15. The method of claim 8 wherein between bursts, the feedback values are retained for use at the start of a next burst.

16. The method of claim 8 wherein between bursts when data is not provided, an idling pattern is provided to the first and second signal paths.

17. The method of claim 1 wherein the first and second level control signals are responsive to target optical transmitter power levels.

18. The method of claim 17 wherein between bursts, the optical transmitter power levels at the end of a prior burst are retained for use at the start of a next burst.

19. The method of claim 18 wherein between bursts, when data is not provided, an idling pattern is provided to the first and second signal paths.

20. The method of claim 1 further comprising:
filtering the first and second error signals in respective loop filters; and
using outputs of the loop filters to adjust a high optical power level and a low optical power level of the optical transmitter to achieve a target average optical power level and extinction ratio.

21. The method of claim 1 further comprising:
providing a first calibration pattern to control the optical transmitter, measuring the average power of the optical transmitter using a DC optical power meter and adjusting the programmable gain code and average power target to achieve a desired measured average optical power.

22. The method of claim 21 wherein the first calibration pattern and the averages of the outputs of the loop filters provide a measure of the laser extinction ratio for a given extinction ratio target.

23. The method of claim 22 further comprising:
providing an external calibration pattern to calibrate the extinction ratio by matching measured values of averages of the outputs of the loop filters to stored values from the first calibration pattern.

24. The method of claim 1 further comprising:
providing, by filtering, a virtual AC ground for the mutual node connecting the optical transmitter and the monitor diode.

25. The method of claim 24 further comprising:
providing an output responsive to an analog output of the monitor diode for tuning multiple external components for each transmitter optical Subassembly configuration.

26. Apparatus for controlling the power levels of an optical transmitter comprising:
a first signal path, including a first amplifier and a filter, for receiving and filtering a transmit signal also used to control the optical transmitter, the first amplifier providing a first output representing a first logic state responsive to the transmit signal and a first level control signal, and a second output representing a second logic state responsive to the transmit signal and a second level control signal;

a second signal path, including a second amplifier and a filter, for receiving and filtering a signal from a monitor diode monitoring the emission of the optical transmitter;

the filters in the first and second signal paths providing filtered signals having a similar frequency response;

first differential peak detectors for providing outputs to first and second comparators for comparing, the upper excursions of the transmit signal as filtered in the first signal path and the monitor diode signal as filtered in the second signal path, and the lower excursions of the transmit signal as filtered in the first signal path and the monitor diode signal as filtered in the second signal path; and circuitry for adjusting a high optical power level and a low optical power level of the optical transmitter based on the output of the first differential peak detectors to achieve a target average optical power level and extinction ratio.

27. The apparatus of claim 26 wherein the circuitry for adjusting a high optical power level and a low optical power level of the optical transmitter based on the output of the first differential peak detectors to achieve a target average optical power level and extinction ratio comprises circuitry for combining multiple comparisons between the upper excursions of the transmit signal as filtered in the first signal path and the monitor diode signal as filtered in the second signal path and multiple comparisons between the lower excursions of the transmit signal as filtered in the first signal path and the monitor diode signal as filtered in the second signal path to achieve a target average optical power level and extinction ratio.

28. The apparatus of claim 27 wherein the circuitry for combining multiple comparisons comprises circuitry for giving some comparisons more weight than other comparisons based on different data strings.

29. The apparatus of claim 28 wherein the circuitry for giving some comparisons more weight than other comparisons based on different digit strings comprises second and third peak detectors that are faster than the first differential peak detectors.

30. The apparatus of claim 28 wherein the circuitry for giving some comparisons more weight than other comparisons comprises:
    a data string detector having;
    second and third peak detectors, each having a higher frequency response than the first differential peak detectors;
    third and fourth comparators;
    the third comparator being coupled to compare;
        a) the upper excursion of the transmit signal as output by the first differential peak detectors with an output of the second peak detector detecting the upper excursion of the transmit signal as filtered in the first signal path; and
    the fourth comparator being coupled to compare;
        b) the lower excursion of the transmit signal as output by the first differential peak detectors with an output of the third peak detector detecting the lower excursion of the transmit signal as filtered in the first signal path;
    or
    the third comparator being coupled to compare;
        a) the upper excursion of the monitor diode signal as filtered in the first signal path with an output of the second peak detector detecting the upper excursion of the transmit signal as filtered in the first signal path; and
    the fourth comparator being coupled to compare;
        b) the lower excursion of the monitor diode as filtered in the first signal path with an output of the third peak detector detecting the lower excursion of the monitor diode signal as filtered in the first signal path.

31. The apparatus of claim 28 wherein the circuitry for giving some comparisons more weight than other comparisons comprises:
    a data string detector having;
    second and third peak detectors, each having a higher frequency response than the first differential peak detectors;
    third and fourth comparators;
    the third comparator being coupled to compare;
        a) the upper excursion of the transmit signal as output by the first differential peak detectors with an output of the second peak detector detecting the upper excursion of the transmit signal as filtered in the first signal path; and
    the fourth comparator being coupled to compare;
        b) the lower excursion of the transmit signal as output by the first differential peak detectors with an output of the third peak detector detecting the lower excursion of the transmit signal as filtered in the first signal path.

32. The apparatus of claim 26 wherein outputs of the first differential peak detectors are coupled back to the first amplifier in the first signal path as the first and second level control signals.

33. The apparatus of claim 32 further comprising circuitry to retain values of the first and second level control signals between bursts.

34. The apparatus of claim 32 further comprising providing an idling pattern to the first and second signal paths between bursts when data is not provided.

35. The apparatus of claim 32 wherein the outputs of the first differential peak detectors are coupled back to the amplifier in the first signal path through loop filters as the first and second level control signals.

36. The apparatus of claim 35 wherein the circuitry for adjusting a high optical power level and a low optical power level of the optical transmitter based on the output of the first differential peak detectors to achieve a target average optical power level and extinction ratio comprises circuitry responsive to the first and second level control signals to control the power levels of the optical transmitter.

37. The apparatus of claim 35 further comprising circuitry responsive to the first and second level control signals and inputs of target average optical power and extinction ratio to control the power levels of the optical transmitter.

38. The apparatus of claim 35 further comprising:
    a pattern generator simulating a control of the optical transmitter; and
    circuitry to provide outputs of averages of the outputs of the loop filters to calibrate the optical transmitter gain;
    whereby the optical transmitter gain may be calibrated.

39. The apparatus of claim 26 further comprising monitoring signal outputs responsive to outputs of the first differential peak detectors as being indicative of the high optical power level and the low optical power level of the optical transmitter.

40. The apparatus of claim 26 wherein the first and second level control signals are calculated values of target optical transmitter power levels.

41. The apparatus of claim 40 further comprising providing an idling pattern to the first and second signal paths between bursts when data is not provided.

42. The apparatus of claim 26 wherein between bursts, the optical transmitter power levels at the end of a prior burst are retained for use at the start of a next burst.

43. The apparatus of claim 26 wherein the second amplifier in the second signal path has programmable gain.

44. The apparatus of claim 26 wherein the filters in the first and second signal paths are programmable filters.

45. The apparatus of claim 44 further comprised of an adaptation circuit senses frequency content in outputs of the filters in the first and second signal paths and adjusts the filters accordingly to match the frequency content of the outputs of the two filters.

46. The apparatus of claim 26 further comprising circuitry to provide an output responsive to an analog output of the monitor diode for tuning multiple external components for each transmitter optical Subassembly configuration.

* * * * *